United States Patent [19]
Fushiki et al.

[11] Patent Number: 4,803,115
[45] Date of Patent: Feb. 7, 1989

[54] GLASS FIBER-REINFORCED ELECTRICAL LAMINATES AND A CONTINUOUS PRODUCTION METHOD THEREFOR

[75] Inventors: Yasuo Fushiki, Takatsuki; Minoru Isshiki, Otsu; Hiroshi Nakano, Ashiya; Masayuki Oizumi, Otsu; Masayoshi Shimomura, Shiga; Keiji Imajo, Otsu, all of Japan

[73] Assignee: Kanegafuchi Kagaku Kogyo Kabushiki Kaisha, Osaka, Japan

[21] Appl. No.: 911,531

[22] Filed: Sep. 25, 1986

[30] Foreign Application Priority Data

Sep. 27, 1985 [JP] Japan ................................. 60-215998
Oct. 15, 1985 [JP] Japan ................................. 60-230869
Oct. 15, 1985 [JP] Japan ................................. 60-230870
May 16, 1986 [JP] Japan ................................. 61-113211
May 16, 1986 [JP] Japan ................................. 61-113212

[51] Int. Cl.$^4$ ............................................. B05D 5/00
[52] U.S. Cl. .................................... 428/285; 428/246; 428/251; 428/260; 428/261; 428/273; 428/284; 428/415; 428/416; 428/417; 428/418; 428/431; 428/432; 428/457; 428/482
[58] Field of Search ............... 428/901, 273, 285, 284, 428/246, 260, 261, 251, 415, 416, 431, 482

[56] References Cited

U.S. PATENT DOCUMENTS

| | | | |
|---|---|---|---|
| 3,499,821 | 3/1970 | Zinbarg | 428/273 |
| 3,927,234 | 12/1975 | Lindner | 428/273 |
| 3,955,024 | 5/1976 | Goldman et al. | 428/901 |
| 4,091,157 | 5/1978 | Hori et al. | 428/246 |
| 4,388,129 | 6/1983 | Oizumi et al. | 428/901 |
| 4,451,317 | 5/1984 | Oizumi et al. | 428/251 |
| 4,587,161 | 5/1986 | Barrell et al. | 428/288 |

Primary Examiner—Sharon A. Gibson
Attorney, Agent, or Firm—Armstrong, Nikaido, Marmelstein & Kubovcik

[57] ABSTRACT

There is provided an electrical laminate comprising a cured assemblage of a plurality of glass fiber type substrates impregnated with a curable resin composition containing (a) a halogenated bisphenol type unsaturated polyester resin and (b) an epoxy acrylate resin which may optionally be halogen-containing. This laminate features high dimensional stability, improved through-hole reliability, and excellent mechanical strength. A continuous production method for laminates is also described.

6 Claims, No Drawings

GLASS FIBER-REINFORCED ELECTRICAL LAMINATES AND A CONTINUOUS PRODUCTION METHOD THEREFOR

BACKGROUND OF THE INVENTION

1. Field of the Invention

The present invention relates to laminated boards for mounting various electrical or electronic component parts thereon, single-or double side metal foil-clad laminates for use as printed circuit boards, and a continuous production method for such products.

2. Description of the Prior Art

More and more stringent requirements have been imposed on resin compositions for use in the manufacture of electrical laminates in respect of chemical, mechanical and electrical properties. Up till recently, paper-based phenolic resin laminates were mainly used in home appliances and glass-based epoxy resin laminates in the field of office automation equipment and industrial devices. Recently, unsaturated polyester resins have been gathering attention in electrical laminate applications partly because of their superior electrical characteristics and partly because they can be formed in a continuous process, and products incorporating them are available on the market. However, unsaturated polyester resins generally have the disadvantage that they have a poor adhesive affinity for glass substrates such as glass cloth and glass paper. Furthermore, as a printed board manufacturing line using solvent development type dry films for reproduction of circuit patterns require large quantities of a solvent such as methylene chloride, resistance to chlorine-type solvents has important implications. Moreover, as printed circuit boards become more and more reduced in size, thickness and weight, the proportion of double-side metal foil-clad laminates calling for through-hole plating is on the steady increase. In these areas of technology, FR-4, G-10, CEM-3 and other products comprising a glass base or substrate and an expoxy resin as main components are available and because of their satisfactory dimensional stability in thickness direction, electrical laminates with high through-hole reliability have been provided.

In contrast, curable unsaturated resins such as unsaturated polyester resins and epoxy acrylate resins can be endowed with various desirable characteristics over the conventional epoxy resins but are inferior in plating performance so that no sufficient through-hole reliability can be obtained. The object of the present invention is to provide an electrical laminate which is mainly characterized by the use of a special curable resin composition and adapted to overcome the abovementioned disadvantages.

With the recent increase in the production and use of home, office and industrial electronic equipment, the demand for printed circuit boards has been on the steady increase and there is a keen demand for development of a method for manufacturing superior boards at low cost. To meet the demand, the present inventors previously proposed a continuous production method for mass production of metal foil-clad laminates in Japanese Patent Application Kokai Nos. 55-4838 and 56-98136, among others, and products manufactured by the method have already been made available commercially from the applicants' company under the registered trademark of Excelite and have been well-accepted by the users. The above method may be summarized as follows A plurality of substrates or base materials are continuously withdrawn and impregnated with a resin dope in the course of transit. The impregnated substrates are combined, clad with metal foil and cured continuously. The highlight of this process lies in the use of a liquid resin such as an unsaturated polyester resin as an impregnating agent and, therefore, it is characterized in that only a nominal molding pressure is applied at laminating and curing stages Therefore, special contrivances are required in regard to the adhesive to be used and the method of bonding for the purpose of ensuring adequate peel strength between the insulating plate of resin-impregnated substrates and the metal foil or foils. Thus, in the conventional common practice of laying a metal foil on a pregreg and pressing the same under heating to achieve simultaneous molding of the laminated board and adhesion of the metal foil, the impregnating resin is a semi-cured solid and the metal foil is one carrying a semi-cured adhesive. For the bonding of metal foil by this press method, a polyvinyl butyral-modified phenolic resin, for instance, is commonly employed as an adhesive. However, when such an adhesive is used in a continuous production line, the lack of sufficient molding pressure results in poor peel strength. For this reason, the present inventors proposed in Japanese Patent Application Kokai No. 56-8227, etc. an improved method which comprises applying an adhesive such as an epoxy resin to the laminating surface of the metal foil in line, heating the coated surface, and applying an uncured laminate However, the performance requirements of the using industry are becoming more and more exacting and rigorous and particularly products showing improved peel strength at room temperature and elevated temperature are being demanded. It is another object of the present invention to meet this requirement When the above-mentioned continuous process was practiced to manufacture a laminated board consisting of at least two substrate layers and clad externally on both sides, it was found that the adhesion between glass cloth and unsaturated polyester resin was poor and that pretreatment of glass cloth with a silane coupling agent failed to fully satisfy the requirement. Furthermore, when glass cloth is used in the above continuous process, the glass cloth tends to suffer from mesh distortion in transit to cause twisting and curling of the product and other drawbacks. Moreover, as the press is not used in the above-mentioned continuous process, the weave pattern may appear on the foil surface of the laminate clad with copper foil on one side or both sides so that the printing of delicate circuits is sometimes made difficult. Japanese Patent Application Kokai No. 59-209829 teaches a continuous method for production of glass-unsaturated polyester laminated boards in which glass substrates are pre-impregnated with epoxy resin. However, epoxy resin generally features a long cure time for complete cure and if it be shortened, the pot life of the dope is curtailed to the extent that it is not suitable for continuous production. Furthermore, as epoxy resins generally call for the use of amines or acid anhydrides as curing agents, severe discoloration on heating or deterioration of physical properties may take place to detract from the marketability of products. In addition, epoxy resin is high in viscosity and, hence, poor in impregnating performance so that it is generally used after dilution with a solvent However, the solvent must be completely evaporated of.

It is a further object of the present invention to provide electrical laminates and a method of manufacturing the same, which are free from the above-mentioned disadvantages, problems and drawbacks.

It is also an object of the present invention to provide a continuous production process for composite laminated boards which are attracting attention today. Thus, in the prior art technology in this area, a method is known for improving the dimensional stability of a composite laminated as manufactured by the press method comprising molding a plurality of superimposed prepregs by means of a hot press. In accordance with this known method, glass cloth and glass paper are disposed on the outer side and in the center, respectively, and the glass paper substrate in the core portion is impregnated with a resin composition containing a large amount of inorganic filler. If such a composite laminate is to be manufactured in the above-mentioned continuous line, it would be necessary to feed an inorganic filler-loaded resin composition selectively to the glass paper core. However, it is not only inconvenient to supply different resin compositions independently the substrates in the same production line but there is the disadvantage that as the recovered resin is actually a mixture of different resin compositions, it cannot be reused. It might be contemplated to feed a filler-rich resin dope to the outer glass cloth substrate as well but the amount of filler cannot be increased so much because of mesh plugging of the glass cloth.

It is, therefore, a further object of the present invention to enable continuous production of a composite laminated board containing an inorganic filler in a high concentration in the core portion thereof and having excellent dimensional stability. The present invention is carried into practice by using a curable resin composition comprising (a) a halogenated bisphenol type unsaturated polyester resin and (b) an epoxy acrylate resin which may be halogen-containing, supplemented if necessary with (c) a vinyl-or carboxy-terminated butadiene based oligomer which is soluble in (a) and (b).

The halogenated bisphenol type unsaturated polyester resin can be obtained by using, as a glycol component, the adduct of a halogenated bisphenol to an alkylene oxide and performing the condensation reaction with the polybasic acid component by a conventional method. An alkylene oxide adduct with bisphenol A is preferable and said adduct is used preferably in an amount of at least 10 mole percent of the total glycol component.

It is also preferable that the glycol component should contain neopentyl glycol, which may optionally be halogen-containing. In such occasion, said glycol is used preferably in an amount of at least 10 mole percent of the glycol component remaining after exclusion of the bisphenol A-alkylene oxide adduct from the total glycol component.

The epoxy acrylate resin can be obtained by reacting, under ring opening, the terminal glycidyl groups of a polyfunctional epoxy compound with (meth)acrylic acid. Bisphenol-based epoxy compounds, novolakor resol-based epoxy compounds and the like aromatic ring-containing epoxy compounds are preferred as the epoxy compound from the chemical resistance, heat resistance and water resistance viewpoints.

The curable resin composition according to the invention contains a crosslinking monomer, such as styrene, as a constituent of the unsaturated polyester resin. The ratio between (a) the halogenated bisphenol type unsaturated polyester resin with such crosslinking monomer contained therein and (b) the epoxy acrylate resin is preferably 30–90 to 70–10, more preferably 50–70 to 50–30.

The liquid butadiene-based oligomer is, for example, vinyl- or carboxy-terminated polybutadiene, acrylonitrile-butadiene copolymer or acrylonitrile-butadiene-styrene copolymer, which is soluble in a monomer used mainly as the crosslinking agent for (a) and (b), such as styrene, divinylbenzene or diallyl phthalate. The incorporation of a rubber component such as the above-mentioned liquid butadiene-based oligomer in the curable resin composition leads to production of electrical laminates with increased plate adhesion and much improved through-hole reliability.

The liquid butadiene-based oligomer soluble in the curable resin composition is used in an amount of 1–10 weight parts, preferably 2–5 weight parts, per 100 weight parts of the curable resin composition.

The glass fiber substrates include glass cloth, glass nonwoven fabric made by the wet or dry process, glass paper, mixed glass paper and so on.

Compared with the conventional products based on unsaturated polyester resin, the electrical laminate according to the present invention is by far superior in inter-substrate peel strength and chemical resistance and even superior in flame retardation property, heat resistance and water resistance.

Furthermore, the present invention provides a metal foil-clad laminate comprising a laminated assembly of a plurality of substrates impregnated with a curable resin composition as clad with metal foil through a layer of an epoxy type adhesive agent containing at least 5 weight percent of bisphenol S type epoxy resin. As adhesive agent mentioned just above has excellent resistance to chemicals and heat, it permits production of a useful metal foil-clad laminate without the disadvantage of the product being adversely affected by the inferior quality of the adhesive despite the use of a curable resin composition having excellent resistance to chemicals and heat. As said adhesive agent, an amine-curable epoxy type adhesive is preferred. Amine curing agents may be classified into aromatic polyamines, alicyclic polyamines, aciphatic polyamines, and polyamine amines. Aromatic polyamines have the disadvantage of coloration with time. Alicyclic polyamines have the advantages of freedom from coloration and high heat resistance but generally have the disadvantage of brittleness and poor adhesion to metal foil. Aliphatic amines and polyamide amines have the disadvantage of poor heat resistance. However, when a mixture of an alicyclic polyamine and dimethylaminopropylamine is used as a curing agent for said epoxy resin, the metal foil on the metal-clad laminate shows an excellent adhesive strength at room temperature as well as at elevated temperature and the coloration of the adhesive layer is minimized.

The curable resin composition according to the present invention can be advantageously applied to the manufacture of electrical laminates. Thus, a plurality of substrates are impregnated with the resin composition and superimposed. Then, a cover sheet or a metal foil is laid on either exposed surface of the assemblage and the whole assembly is formed and cured to give an electrical laminate or a single-or double-side metal foil-clad laminate. The substrates may for example be glass fiber materials such as glass cloth, glass mat, glass paper, etc. and/or mixed sheets of glass fiber with cellulosic materials. The resin composition according to the present invention is particularly advantageous in the manufacture of composite laminates uaing heterogenous materials such as a combination of glass cloth and glass paper.

When the resin-impregnated substrates assembled as above are cured, it is most advantageous to effect continuous curing under substantially no pressure as described in Japanese Patent Application Kokai No. 56-98136. Thus, as a plurality of substrates are continuously conveyed in rows, they are independently impregnated with the curable resin composition according to the present invention (i.e. a radical-polymerization curable resin composition which is liquid as it is and does not liberate reaction byproducts in curing). The resin-impregnated substrates are assembled and further laminated with a cover sheet and/or a metal foil. The whole assemblage is continuously cured and cut to size. In the above process, when a glass cloth substrate is disposed on either external side and a different substrate such as glass paper is disposed therebetween, a satisfactory glass cloth-reinforced electrical laminate can be obtained by pre-treating the glass cloth with a radical-polymerization type curable resin dope which has better adhesivity to glass cloth than said curable resin composition for impregnation use. When the glass cloth substrates to be disposed on the outermost sides are pretreated with the above resin dope so as to have the resin distributed on the glass cloth surface, interlayer peel strength is improved. Moreover, as the meshes of glass cloth are filled with the above pretreating resin, the surface smoothness of the metal foil is improved so that delicate circuits can be easily printed. In addition, as the weave meshes of the glass cloth are made secure by the above pretreatment, the mesh distortion in transit is prevented so that the curling and twisting of the laminate are minimized.

As a radical-polymerization type curable resin composition is used as the pretreating resin dope, the reaction time is curtailed and the continuous process productivity is increased. Moreover, as curing agents such as amines and acid anhydrides are not required, thermal disoloration and degradation of physical properties can be avoided. Further, because the viscosity of the radical polymerization type curable resin composition can be adjusted with a cross-linking monomer, e.q. styrene, instead of a solvent, the step for removal of a solvent can be omitted and the incidence of rejects owing to post-cure foaming due to solvent residues can be eliminated. Furthermore, as both the pretreating resin and the impregnating resin compositions are radical polymerization type resin compositions, there can be realized fair improvements in interlayer peel strength and other physical properties, probably because of inter-crosslinking, as compared with the case in which, as taught in Japanese Patent Application Kokai No. 59-209829, resins of different curing systems are employed for pretreatment and impregnation, respectively.

Moreover, in the composite electrical laminate consisting of glass cloth-reinforced surface layers and a glass nonwoven fabric (such as glass fiber, glass mat, etc.) -reinforced core layer, the surface smoothness and dimensional stability in thickness direction can be improved by incorporating an inorganic filler in the core layer.

In the above-mentioned continuous production process, the inorganic filler can be advantageously incorporated in a high concentration by depositing the filler on the nonwoven fabric substrate with the aid of an organic binder beforehand.

By deposrting an organic filler on the nonwoven fabric which is to form the core beforehand in this manner, a high-density incorporation of the inorganic filler in the core portion can be accomplished even if the same resin composition is used for impregnation of all substrates. When a double-side metal foil-clad laminate is manufactured in the method according to the present invention, the through-hole reliability is emarkably improved.

Halogenated bisphenol type unsaturated polyester resin

Generally, unsaturated polyester resins are composed of an unsaturated polyester (alkyd) and a monomer for curing or crosslinking.

The unsaturated polyester (alkyd) is an oligomer obtained by subjecting to condensation under dehydration an acid component consisting of a unsaturated polybasic carboxylic acid alone or of a mixture of an unsaturated polybasic carboxylic acid and a saturated polybasic carboxylic acid and/or an unsaturated monocarboxylic acid, and a glycol component consisting of a glycol alone or of a mixture of a glycol and a monoalcohol.

In accordance with the invention, it is essential that the resin component (a) should contain, as a glycol component, an alkylene oxide adduct of a halogenated bisphenol, such as the ethylene oxide or propylene oxide adduct of tetrabromobisphenol A. For the improvement in water resistance, it is preferable that the glycol component should further contain neopentyl glycol or a halogenated neopentyl glycol, such as dibromoneopentyl glycol. Said resin component may contain as glycol components other than those mentioned above, ethylene glycol, propylene glycol, butanediol, diethylene glycol, dipropylene glycol, hexanediol, polyethylene glycol, polypropylene glycol, polytetramethylene glycol, and so forth. The monoalcohol is, for example, hydroxylated dicyclopentadiene or ethylene glycol monomethyl ether. In some instances, stearyl alcohol, polyethylene glycol monomethyl ether, polypropylene glycol monomethyl ether, or the like may be used in part.

From the chemical resistance viewpoint, the halogenated bisphenol-alkylene oxide adduct should desirably account for at least 10 mole percent, more preferably at least 20 mole percent, of the total glycol component. It is desirable that neopentyl glycol or a halogenated derivative thereof should account for at least 10 mole percent, preferably 20 mole percent or more, more preferably 40 mole percent, of the glycol component remaining after exclusion of the halogenate bisphenol-alkylene oxide adduct from the total glycol component.

The acid component of the unsaturated polyester may be an ordinary one. Thus, maleic anhydride, maleic acid, fumaric acid and the like are usable as unsaturated polybasic carboxylic acids, and phthalic acid, isophthalic acid, terephthalic acid, tetrahydrophthalic acid, endic acid, trimellitic acid, pyromellitic acid, tetrabromophthalic acid, dibromoterephthalic acid and chlorendic acid, and acid anhydrides of these as saturated polybasic carboxylic acids. In some instances, adipic acid, sebacic acid, and acid anhydrides of these may be used in part. Maleated dicyclopentadiene and the like may be mentioned as the unsaturated monocarboxylic acid.

Styrene is generally used as the crosslinking monomer. However, α-methylstyrene, vinyltoluene, p-methylstyrene, chlorostyrene, divinylbenzene, $C_1$-$C_{10}$ alkyl (meth)acrylate, diallyl phthalate, triallyl cyanurate and the like may also be used. The crosslinking monomer is used in an amount of 10-70 weight percent, preferably 20-50 weight percent, of the whole unsaturated polyester resin (a).

Epoxy acrylate resin

The epoxy acrylate resin can be produced by reacting a polyfunctional epoxy compound with (meth)acrylic acid under opening of the oxirane ring.

As examples of the polyfunctional epoxy compound, there may be mentioned the reaction product from a bisphenol and epichlorohydrin, the reaction product from novolak or resol type phenol-formaldehyde condensation product and epichlorohydrin, the reaction product from a polyol and epichlorohydrin, the reaction product from a polybasic acid and epichlorohydrin and the reaction product from a polyalkylene glycol and epichlorohydrin. Aromatic ring-containing epoxy compounds, in particular the reaction product from bisphenol A and epichlorohydrin, are preferred.

The epoxy acrylate resin is produced by reacting the above epoxy compound with an equivalent quantity, relative to said epoxy compound, of acrylic acid or methacrylic acid.

Curable resin composition

The curable resin composition according to the invention should contain the above-mentioned halogenated bisphenol type unsaturated polyester resin (a) in an amount of 30 weight percent or more, preferably 50 weight percent or more, and the above-mentioned epoxy acrylate resin (b) in an amount of 10-70 weight percent, preferably 30-50 weight percent. The halogenated bisphenol-alkylene oxide adduct, which is one of the constituents of the resin (a), is effective in improving the chemical resistance, in particular the resistance to chlorine-containing solvents, and at the same time provides flame retardant property while maintaining the heat resistance and good heat stability. Therefore, when the resin (a) is incorporated in smaller amounts, these effects ca hardly be expected. However, since the single use of the resin (a) cannot afford satisfactory adhesion between glass substrates, such as glass cloths and glass paper sheets, the resin (b) is blended to remedy the drawback. For producing the effect of blending it, the resin (b) should be used in an amount of 10 weight percent, preferably 30-50 weight percent, based on the whole mixture. Thus, the weight ratio between the resin (a) and the resin (b) in the resulting blend is 90:10 to 30:70, preferably 70:30 to 50:50.

The curable resin composition as so referred to herein includes the crosslinking monomer, such as styrene, added thereto. This crosslinking monomer is added generally to both the halogenated bisphenol type unsaturated polyester resin (a) and the epoxy acrylate resin (b) or, as the case may be, to either one of the two. It is required only that the crosslinking monomer is present in a final amount of 20-50 weight percent, preferably 25-45 weight percent, more preferably 30-40 weight percent, based on the whole curable resin composition comprising the resins (a) and (b) plus the liquid butadiene type oligomer (c) if added.

The rubber component, which, when incorporated in the curable resin composition, contributes to improvements in performance characteristics in plating, should preferably be readily erosible in a pretreatment step for plating, and may include, among others, polybutadiene, acrylonitrile-butadiene copolymers and acrylonitrile-butadiene-styrene copolymers. Trial use of such rubber component in the granular form having a grain size of 0.1-5 $\mu$m in diameter often resulted in bad drainage when said component was dispersed in the liquid resin composition for impregnation and the resulting composition was used for impregnation of substrates. it has been found that liquid rubber oligomers are preferable and that, among them, those that are soluble in unsaturated resins bring about good dispersion state after curing. Whereas styrene is a crosslinking agent mainly used for unsaturated polyester resins, epoxy acrylate resins, polyester acrylate resins, urethane acrylate resins and so forth, it has been found that vinyl- or carboxy-containing liquid polybutadiene type oligomers soluble in said styrene are best suited for the achievement of the objects of the present invention, in particular for continuous laminate production. Examples of such oligomers are vinyl- or carboxy-containing liquid polybutadiene, acrylonitrile-butadiene copolymers and acrylonitrile-butadiene-styrene copolymers which are soluble in crosslinking monomers such as styrene, divinylbenzene and diallyl phthalate. Among them particularly preferred are butadiene-based oligomers containing the acrylonitrile constituent which are superior in solubility. These may be of a commercial grade.

The liquid polybutadiene type oligomer (herein sometimes referred to as "rubber component") is used in an amount of 1-10 weight parts, preferably 2-5 weight parts, per 100 weight parts of the curable resin composition. When the rubber component accounts for more than 10 weight parts, the resin solution for impregnation acquires an increased viscosity and accordingly becomes less suited for the impregnation procedure and, at the same time, the dispersibility of the rubber component in electrical laminates is reduced enough to allow easy aggregation of said component, so that the mechanical strength is impaired. Furthermore, since the rubber component has a low glass transition temperature, a excessive amount of the rubber component brings about an increased coefficient of expansion in the thickness direction, whereby the through-hole reliability, one of the important characteristics required of electrical laminates, is impaired. On the other hand, omission of the rubber component may indeed result in improved dimension stability in the thickness direction but will lead to decreased adhesion strength of through-hole platings, so that, after repeated thermal cycles, the plating metal in the through-hole section readily peels off or is broken at the corner or inside the through-hole. In such case, substantial improvement in through-hole reliability can be hardly expected. Metal-clad laminates for use in electrical fields as produced by using a curable resin composition containing the rubber component in an amount of 1-10 weight parts with a rubber dispersibility of 0.01-5 $\mu$m, preferably 0.1-1 $\mu$m, are less subject to the above-mentioned adverse effects of the rubber component but are improved in through-hole plate adhesion strength. The through-hole reliability is thus much improved.

The curable resin composition according to the invention may contain, in addition to the resins (a) and (b), other oligomers which are generally used and radical polymerization-curable, such as other unsaturated (polyesters and diallyl phthalate resins. The composition may of course contain fillers, colorants, fire retardants, and so forth.

The resin composition according to the invntion may contain one or more additive type fire retardants, for example phosphorus-containing fire retardants such as trioctyl phosphate, triphenyl phosphate, tricresyl phosphate, triethyl phosphate, triphenyl phosphite, this(chloroethyl) phosphate and red phosphorus, halogen-containing fire retardants such as chlorinated paraffin, tetrabromobisphenol A and derivatives thereof, brominated diphenyl ether and tribromophenol monoglycidyl ether, antimony compounds such as antimony trioxide, antimony pentoxide and sodium antimonate, zinc borate and aluminum hydroxide.

The resin composition according to the invention can be cured using an organic peroxide for general use, such as benzoyl peroxide. Other preferred examples of the organic peroxide are peroxyketals such as 1,1-bis-(t-butylperoxy)-3,3,5-trimethylcyclohexane and 1,1-bis-(t-butylperoxy)cyclohexane, dialkyl peroxides such as di-t-butyl peroxide, and peroxy esters such as t-butyl peroxybenzoate. These are used in an amount of about 0.5–2.0 parts per 100 parts of the resin composition.

Usable curing catalysts are not limited to those mentioned above. Other known curing catalysis, for example light-sensitive curing catalysis and/or curing catalysts sensitive to radiation or electron beams, may also be utilized either alone or in combination with organic peroxides.

The commonest metal foil used in a printed circuit board is copper foil but aluminum or other metal foil can also be employed. As the cover sheet mentioned hereinbefore, cellophane, polyester and other plastic films, metal foil and other peelable, flexible and impervious sheets can be employed. Since the adhesive is preferable applied in line in the practice of the present invention, a metal foil which has not had an adhesive layer formed thereon beforehand may be employed.

The continuous manufacture of a metal foil-clad laminate is preferably carried out by the method described in Japanese Patent Application Kokai No. 55-4838 and Kokai No. 56-98136, etc. referred to hereinbefore, that is to say under substantially no pressure load. The application of the adhesive agent to the metal foil and the lamination thereof to the uncured substrate assemblage can be effected in accordance with the method described in Japanese Patent Application Kokai No. 56-8227. However, in a preferred embodiment of the present invention, the adhesive agent is preferably an epoxy type adhesive composition containing at least 5 weight percent of a bisphenol S type epoxy resin. Compared with a similar resin composition free of bisphenol S type epoxy resin, the incorporation of this bisphenol S type epoxy resin results in a marked improvement in metal foil peel strength at room temperature and elevated temperature.

The bisphenol S type epoxy resin is typically exemplified by diglycidyl ether which is obtainable by the reaction of bisphenol S (dihydroxydiphenylsulfone) with epichlorohydrin but may be any and all of epoxy resins containing the bisphenol S unit in the backbone structure. For example, an epoxy resin obtainable by co-condensation of bisphenol S and bisphenol A is more readily soluble in the common low-boiling solvents such as methyl ethyl ketone, acetone, etc. and is preferred for the purposes of the present invention. The preferred examples of the epoxy resin to be used in combination with bisphenol S type epoxy resin include bisphenol A epoxy resin, novolac type epoxy resin, alicyclic epoxy resin, bisphenol F type epoxy resin, glycidyl ester type epoxy resin, and glycidylamine type epoxy resin.

The proportion of bisphenol S type epoxy resin is at least 5 weight percent and preferably at least 40 weight percent. The larger the amount of bisphenol S type epoxy resin is, the higher is the metal foil peel strength at room temperature and elevated temperature as well.

The curing agent may be an ordinary curing agent commonly used for epoxy resins. Thus, acid anhydrides, various amines, isocyanate compounds, imidazole compounds, dicyandiamide and amine-borone trifluoride complexes may be mentioned by way of example. Among these curing agents, amine type curing agents are outstanding in terms of metal foil peel strength and, therefore, preferred for the purposes of the present invention. More preferably, a mixture of an alicyclic polyamine and dimethylaminoproylamine is employed. Examples of said alicyclic polyamine include isophoronediamine, 1,3-bisaminomethylcyclohexane, menthanediamine, bis-(4-aminocyclohexyl)-methane, bis-(4-amino-3-methylcyclohexyl)-methane and so on.

The molar ratio of alicyclic polyamine to dimethylaminopropylamine is 95:5 through 50:50 and preferably 90:10 through 65:35. If the proportion of alicyclic polyamine is too high, adhesive strength at room temperature is sacrificed. If conversely the proportion of dimethylaminopropylamine is excessive, adhesive strength at elevated temperature is sacrificed and, in addition, the pot life of the composition is short.

It has been found that the synergistic effect with alicyclic polyamine is not realized when diethylaminopropylamine is used instead of dimethylaminopropylamine.

For the purpose of attenuating the toxicity or adjusting the pot life or cure time, said alicyclic polyamine and/or dimethylaminopropylamine may be reacted with an epoxy resin, acrylonitrile, ethylene glycol or the like so as to partially modify the amine active hydrogen.

The amount of said amine curing agent is approximately equimolar with respect to the epoxy equivalent of the epoxy resin.

In the adhesive compositions to be used in accordance with the present invention, there may be incorporated various additives such as fillers, e.q. glass powder, glass flakes, talc, silica, kaolin, aluminum hydroxide, zinc oxide, etc., colorants, rubber, cure accelerators, oxidation inhibitors, silane coupling agents, and so on.

To prepare an adhesive dope for application to the metal foil, the bisphenol S type epoxy resin may be dissolved in a liquid epoxy resin diluent or in a solvent. When this adhesive dope is used in the continuous manufacture of metal foil-clad laminates in accordance with the method described in Japanese Patent Application Kokai No. 56-8227, etc., a metal foil-clad laminate showing improved peel strength at room temperature and elevated temperature can be manufactured with high efficiency. In a preferred embodiment of the present invention for the continuous manufacture of a metal foil-clad electrical laminate in which a glass cloth substrate is disposed on either side and a glass nonwoven fabric substrate carrying an inorganic filler is disposed as a core, these substrates are conveyed in rows and treated continuously as described in Japanese Patent Application Kokai No. 55-4838 and Kokai No. 56-98136, for instance.

The term "glass cloth" as used in this specification means any and all of fabrics manufactured by weaving a yarn made by bundling 50 to 800 glass filaments about 9 $\mu$m in diameter into various constructions such as satin weave, plain weave, menuki plain weave, twill weave, etc. In accordance with the present invention, such glass cloth is used one on either side of the laminate.

The term "glass nonwoven fabric" means any and all of continuous sheets (glass paper) wet-formed using an aqueous dispersion of glass filaments, 1 to 20 μm in diameter and a binder such as an acrylic resin, polyvinyl alcohol, epoxy resin or melamine-formaldehyde resin, mixed glass paper consisting of paper and glass fiber, and nonwoven fabrics made up of synthetic fiber such as polyester fiber, rayon, asbestos, rock wool, etc. The nonwoven fabric may be partly substituted by paper. The nonwoven fabric may be used, either in a single layer or in a plurality of layers according to the required thickness of the final laminate, to form a core layer. The resin used for pretreating the glass cloth is a resin having a higher bonding affinity for glass fiber than the impregnating resin. This bonding affinity or adhesivity to glass fiber can be measured as the interlayer peel strength. Like the impregnating resin, this pretreating resin may be selected from among radical polymerization type curable resins such as unsaturated polyester resin, epoxy acrylate resin, polyester acrylate resin, urethane acrylate resin, diallyl phthalate resin, and so on. Particularly preferred are epoxy acrylate resin and urethane acrylate resin. For improved adhesion, a rubber component may be introduced into the polymer structure or blended, and the proportion of such rubber component is preferably 2 to 50 weight percent.

Curing of such a radical polymerization type resin calls for a catalyst or a polymerization initiator. The polymerization initiator is generally an organic peroxide and many species are known. Preferred for the purposes of the present invention are the aliphatic peroxides described in Japanese Patent Application Kokai No. 55-53013 and it is most advantageous to use aliphatic peroxy esters singly or in combination. Examples of such peroxides are di-t-butyl peroxide, 2,5-dimethyl-2,5-di(t-butylperoxy) hexane, acetyl peroxide, isobutyryl peroxide, t-butyl peroxy-2-ethylhexanoate and so on. Aliphatic peroxy esters include t-butyl peroxyacetate, t-butyl peroxyisobutyrate, t-butyl peroxy-2-ethylhexanonate, t-butyl peroxylaurate and so on.

The pretreating resin composition mentioned above is used after dilution with a solvent or a liquid polymerizable crosslinking monomer to a suitable viscosity. The amount of deposition of said pretreating resin composition is 5 to 40 weight parts as non-volatile matter, preferably 10 to 30 weight parts, and more desirably 15 to 25 weight parts, per 100 weight parts of glass cloth. If an excessive amount of the pretreating resin is deposited, the saturation amount of the impregnating resin is lowered. Conversely, if the amount is too small, the intended effect cannot be fully attained.

The method for pretreating the glass cloth is optional. For example, one may dilute the pretreating resin with 10 to 50% of a polymerizable solvent monomer, for example styrene, to prepare a pretreating dope of suitable viscosity and deposit it on the glass cloth by coating, dipping or the like technique.

As a curing catalyst such as an organic peroxide is incorporated in the pretreating resin dope, it is preferable to semi-cure the resin on the glass cloth after deposition, for the decrease of pretreatment effect owing to dissolution of the deposited pretreating resin in the impregnating resin applied later is thereby prevented. This pretreatment can be carried out in a continuous laminate production line or can be carried out in an independent line and fed to the production line from a takeup roll.

The core substrate layer may be made up of glass cloth or may be made of glass nonwoven fabric to provide a composite structure. When a glass nonwoven fabric is used, an inorganic filler is preferably incorporated to a high density for ensuring dimensional stability and surface smoothness.

The inorganic filler must be water-insoluble and electrically insulating. As examples of said inorganic filler there may be mentioned metal oxides such as silica, alumina, zirconia, titanium dioxide, zinc white, etc., metal hydroxides such as magnesium hydroxide, aluminum hydroxide, etc., natural minerals such as talc, kaolin, mica, wollastonite, clay minerals, etc., and insoluble salts such as calcium carbonate, magnesium carbonate, barium sulfate, calcium phosphate and so on. Inorganic fillers of high specific gravity or large bulk size are liable to settle and difficult to handle. Moreover, the treated laminate may present an uneven surface to detract from appearance quality. Therefore, it is preferable to employ an inorganic filler having a small aspect ratio and a particle size not exceeding 10 um. Flame retardants and other additives which fall within the above definition of inorganic fillers can be reckoned as the inorganic fillers according to the present invention.

The organic binder includes, among others, epoxy resin, melamine-formaldehyde resin, polyvinyl alcohol, acrylic resin and so on.

The amount of application of said inorganic filler to the glass nonwoven fabric is 50 to 700 weight parts, preferably 100 to 600 weight parts, and for still better results, 200 to 500 weight parts, per 100 weight parts of nonwoven fabric. This range is suitable in consideration of the balance between the improvement of dimensional stability and the saturation amount of the impregnating resin.

The proportion of said organic binder is 1 to 60 weight parts, preferably 2 to 40 weight parts, to each 100 weight parts of said inorganic filler. In this range, the inorganic filler can be gently retained on the nonwove fabric.

The method for application to the glass nonwoven fabric is optional. For example, one may feed a dispersion of said inorganic filler and organic binder in a suitable medium such as water to the nonwoven fabric by coating, dipping or the like and, then, dry the treated nonwoven fabric to remove the dispersion medium. As the nonwoven fabric, especially glass paper, has a low density and low tensile and other mechanical strengths, it tends to break in a continuous production line but if a suitable binder is chosen in the above treatment, the tensile strength of the nonwoven fabric can be increased so as to prevent troubles such as breakage.

In the practice of the present invention, said inorganic filler can be added in an amount not exceeding 50 weight parts, preferably in an amount of 10 to 35 weight parts, to each 100 weight parts of the impregnating resin. By so doing, the dimensional stability in thickness direction is further improved and, as a result, the through-hole reliability is increased.

The following examples illustrate the invention in further detail. In the examples, "part(s)" and "percent (%)" are on the weight basis.

SYNTHESIS EXAMPLE 1

An unsaturated polyester was synthesized by subjecting to dehydration condensation 1 mole of ethylene glycol, 1 mole of neopentyl glycol, 1 mole of tetrabromobisphenol A-ethylene oxide (2 moles) adduct, 1 mole of isophthalic acid and 2 moles of maleic anhydride in the conventional manner. A halogenated bisphenol-based unsaturated polyester resin was prepared by adding, to the unsaturated polyester thus synthesized, styrene monomer in an amount of 30% on the whole resin basis.

SYNTHESIS EXAMPLE 2

An unsaturated polyester was synthesized by subjecting to dehydration condensation 0.25 mole of ethylene glycol, 0.25 mole of neopentyl glycol, 2.5 moles of tetrabromobisphenol A-ethylene oxide (2 moles) adduct, 1 mole of isophthalic acid and 2 moles of maleic anhydride in the conventional manner, followed by addition thereto of styrene monomer in an amount of 30% on the whole resin basis to give a halogenated bisphenol-based unsaturated polyester resin.

SYNTHESIS EXAMPLE 3

An unsaturated polyester was synthesized by subjecting to dehydration condensation 2 moles of ethylene glycol, 1 mole of tetrabromobisphenol A-ethylene oxide (2 moles) adduct, 1 mole of isophthalic acid and 2 moles of maleic anhydride, followed by addition thereto of styrene monomer in an amount of 30% on the whole resin basis to give a halogenated bisphenol-based unsaturated polyester resin.

SYNTHESIS EXAMPLE 4

An unsaturated polyester was synthesized by subjecting to dehydration condensation 3 moles of ethylene glycol, 1 mole of isophthalic acid and 2 moles of maleic anhydride in the conventional manner, followed by addition thereto of styrene monomer in an amount of 30% on the whole resin basis to give an iso type unsaturated polyester resin.

SYNTHESIS EXAMPLE 5

An unsaturated polyester was synthesized by subjecting to dehydration condensation 2 moles of ethylene glycol, 2 moles of dibromoneopentyl glycol, 1 mole of isophthalic acid and 3 moles of maleic anhydride in the conventional manner, followed by addition thereto of styrene monomer in an amount of 30% on the whole resin basis to give a halogenated aliphatic unsaturated polyester resin.

EXAMPLE 1

A curable resin composition was produced by mixing 70 parts of the unsaturated polyester resin obtained in Synthesis Example 1, 30 parts of a bisphenol A-based epoxy acrylate resin (tradename: RIPOXY R-806; styrene monomer content 45%; product of Showa Kobunshi K.K.), 3 parts of antimony trioxide and 1 part of benzoyl peroxide.

EXAMPLE 2

A curable resin composition was produced by mixing 50 parts of the unsaturated polyester resin obtained in Synthesis Example 2, 50 parts of a bisphenol A-based epoxy acrylate resin (RIPOXY R-806), 3 parts of antimony trioxide and 1 part of benzoyl peroxide.

EXAMPLE 3

A curable resin composition was produced in the same manner as in Example 1 except that the unsaturated polyester resin obtained in Synthesis Example 3 was used in lieu of the unsaturated polyester resin obtained in Synthesis Example 1.

COMPARATIVE EXAMPLE 1

A resin composition was produced by mixing 70 parts of the unsaturated polyester resin obtained in Synthesis Example 3, 30 parts of the iso type polyester resin obtained in Synthesis Example 4, 3 parts of antimony trioxide and 1 part of benzoyl peroxide.

COMPARATIVE EXAMPLE 2

A resin composition was produced by mixing 30 parts of a bisphenol A-based epoxy acrylate resin (RIPOXY R-806), 70 parts of the aliphatic unsaturated polyester resin obtained in Synthesis Example 5, 3 parts of antimony trioxide and 1 part of benzoyl peroxide.

Laminate production

Substrates each composed of glass cloths on both side and a glass paper sheet sandwiched therebetween were individually impregnated with one of the resin compositions produced in the above examples and comparative examples while they were transferred continuously. Laminates were produced by superposing five substrates thus impregnated followed by further superposing of a 35-μm-thick electrolytic copper foil (tradename: T-8; silane coupling agent-treated; product of Fukuda Kinzoku K.K.) coated with an epoxy type adhesive to a thickness of 30 μm. The laminates were cured at 100° C. for 20 minutes, cut, and postcured at 160° C. for 20 minutes to give one-side copper-clad laminates having a thickness of 1.6 mm. The performance characteristics of the laminates are given below in Table 1.

TABLE 1

|  | Example | | | Compar. Example | |
|---|---|---|---|---|---|
|  | 1 | 2 | 3 | 1 | 2 |
| Fire retardant property UL 94 | Vo | Vo | Vo | Vo | Vo |
| Chemical resistance (Resistance to methylene chloride) (Note 1) |  |  |  |  |  |
| Heat resistance (Discoloration at 180° C. × 1 hr) (Note 2) |  |  |  |  |  |
| Bending strength retention (%) after aging (170° C. × 1,000 hrs) UL 746B | 97 | 98 | 97 | 95 | 51 |
| Water absorption (%) JIS C 6481-5.14 | 0.09 | 0.10 | 0.15 | 0.17 | 0.12 |
| Interlayer peel strength | 2.0 | 2.3 | 2.0 | 1.4 | 1.8 |

TABLE 1-continued

|  | Example | | | Compar. Example | |
|---|---|---|---|---|---|
|  | 1 | 2 | 3 | 1 | 2 |
| (kg/cm) (Note 3) | | | | | |

Notes:
1 According to JIS C 6481-5.13.3, the samples were immersed in methylene chloride at 30° C. for 10 minutes and then examined macroscopically for loss in surface gloss, surface roughening, swelling, peeling and other significant changes in appearance.
No changes in appearance
No gloss
Surface roughening
2 According to JIS C 6881-5.6, the samples were heat-treated in an oven maintained at 180° C. for 1 hour and then examined macroscopically for swelling or peeling on the copper foil face and the opposite laminate face and for the extent of discoloration.
No changes in appearance
Advanced discoloration
3 The copper foil and one glass cloth layer in contact therewith were peeled off from 80 × 10 mm test specimens. The test procedure described in JIS C 6481-5.7 for peel strength measurement was followed. Temperature 20 ± 1° C.; testingspeed 50 mm/min; x̄ of lowest values.

EXAMPLE 4

A continuously fed 35-μm-thick electrolytic copper foil (T-8) was coated with the adhesive A, the composition of which is given in Table 2, to a thickness of 30 μm with a blade coater. The solvent was then removed in a precuring oven for the adhesive where precuring was also achieved. This adhesive-coated copper foil was superposed on one side of a five-substrate-layer laminate continuously prepared in the same manner as above using the curable resin composition produced in Example 1, and a polyester film was superposed on the opposite face. The resultant laminate was heat-cured for 20 minutes in a tunnel type curing oven maintained at 100° C. while they were transferred continuously through the oven. Then, the polyester film was peled off, the laminate was cut, and further postcured at 160° C. for 20 minutes to give one-side copper-clad laminates having a thickness of 1.6 mm. The performance characteristics of the laminates are given in Table 3.

EXAMPLE 5

Using the adhesive B, the composition of which is given in Table 2, and following the procedure of Example 4, one-side copper-clad laminates having a thickness of 1.6 mm were produced. Their performance characteristics are shown in Table 3.

EXAMPLE 6

Using the adhesive C, the composition of which is given in Table 2, and following the procedure of Example 4, one-side copper-clad laminates having a thickness of 1.6 mm were produced. Their performance characteristics are shown in Table 3.

COMPARATIVE EXAMPLE 3

Using the adhesive D, the composition of which is given in Table 2, and following the procedure of Example 4, one-side copper-clad laminates having a thickness of 1.6 mm were produced. Their performance characteristics are shown in Table 3.

TABLE 2

| Composition | Parts by weight | | | |
|---|---|---|---|---|
|  | A | B | C | D |
| Bisphenol S-based epoxy resin (EPICLON EXA-1514, product of Dainippon Ink and Chemicals) | 100 | 50 | 50 | |
| Bisphenol A-based epoxy resin (EPIKOTE E-1001; product of Yuka Shell Epoxy) | | 50 | 50 | 100 |
| Isophorone diamine | 15 | 12 | 8 | 10 |
| Dimethylaminopropylamine | 0 | 0 | 4 | 0 |
| Dioxane | 60 | 60 | 60 | 60 |

TABLE 3

| Item | Treatment conditions | In kg/cm | | | |
|---|---|---|---|---|---|
|  |  | Example 4 | Example 5 | Example 6 | Compar. Example 3 |
| Copper foil peel strength under normal conditions | C-96/20/65 | 1.75 | 1.64 | 2.10 | 1.50 |
| Copper foil peel strength under heating | E-1/150 | 0.96 | 0.77 | 0.85 | 0.31 |

EXAMPLE 7

Double-side copper-clad composite laminates having a thickness of 1.2 mm were produced in a continuous manner using glass cloths having a thickness of 180 μm and a basis weight of 210 g/m² as both outermost layers, two glass paper layers having a basis weight of 30 g/m² as intermediate layers and, as clads on both sides, 18-μm-thick copper foils coated with the same epoxy type adhesive as used in Example 6 to a thickness of 40 μm.

As the curable resin composition for impregnation, a liquid resin composition prepared by homogeneously mixing 104 parts of the resin composition produced in Example 1, 30 parts of aluminum hydroxide and 4 parts of a carboxy-terminated liquid polybutadiene (HYCAR CTBN 1300X8; product of B. F. Goodrich Chemical) was used.

The glass cloths were impregnated with a pretreating resin composition which was a rubber-modified epoxy acrylate resin solution containing 50% of styrene monomer and pretreated by drying at 160° C. for 5 minutes. The resin coverage was 20 parts per 100 parts of glass cloth.

The glass paper sheets were immsersed in a treating solution prepared by dispersing 60 parts of aluminum hydroxide and 4 parts of epoxy binder in 80 parts of water plus 20 parts of methanol to form an emulsion, and then dried at 150° C. for 5 minutes, whereby the sheets were loaded with 400 parts of aluminum hydroxide per 100 parts of glass paper.

The substrate materials, with the pretreated glass cloths on both outer sides and the glass paper sheets therebetween, were continuously fed and impregnated individually with the above-mentioned resin solution and then united, followed by superposition of the copper foils on both sides. The resultant laminate was passed through tunnel type curing ovens continuously where curing was performed at 100° C. for 15 minutes and at 150° C. for 10 minutes. The performance characteristics of the product laminate are shown in Table 4 and Table 5.

COMPARATIVE EXAMPLE 4

A double-side copper-clad laminate having a thickness of 1.2 mm was produced in the same manner as Example 7 except that the curable resin solution for impregnation was lacking in the liquid butadiene type oligomer. The performance characteristics of the product are shown in Table 4.

COMPARATIVE EXAMPLE 5

A double-side copper-clad laminate having a thickness of 1.2 mm was produced in the same manner as Example 7 except that the curable resin solution for impregnation cotained 15 parts of the liquid polybutadiene HYCAR CTBN 1300x8. The performance characteristics of the product are shown in Table 4.

COMPARATIVE EXAMPLE 6

A double-side copper-clad laminate having a thickness of 1.2 mm was produced in the same manner as Example 7 except that glass paper sheets were used without treatment with the inorganic filler. The performance characteristics of the product are shown in Table 4.

COMPARATIVE EXAMPLE 7

A double-side copper-clad laminate having a thickness of 1.2 mm was produced in the same manner as Example 7 except that the glass cloths were not subjected to pretreatment. The performance characteristics of the product are shown in Table 5.

TABLE 4

| Item | Unit | Example 7 | Compar. Example 4 | Compar. Example 5 | Compar. Example 6 |
| --- | --- | --- | --- | --- | --- |
| Expansion in thickness direction 30° C. → 260° C. | % | 5.0 | 4.9 | 5.8 | 5.4 |
| Bending strength (20° C.) | kg/mm$^2$ | 30 | 30 | 25 | 31 |
| Through-hole reliability 20° ⇌ 260° C. (oil method) | Times | 150 | 80 | 85 | 70 |
| Plated through-hole drawing strength | kg | 6.5 | 3.2 | 6.3 | 3.8 |

TABLE 5

| Item | Unit | Example 7 | Compar. Example 7 |
| --- | --- | --- | --- |
| Interlayer peel strength | kg/cm | 2.1 | 1.1 |
| Surface smoothness | μm | 2–3.5 | 4–6 |
| Mesh distortion | mm/m | 3 | 15 |

(1) Evaluation of through-hole reliability:

A double-side copper-clad sample having 200 through-holes, 1 mm in diameter, in serial connection was subjected to immersion cycles each comprising immersion at 20° C. for 20 seconds and at 260° C. for 10 seconds. The number of cycles after which the change in electric resistance as measured in high-temperature phase exceeded 10% was reported.

(2) Evaluation of plated through-hole drawing strength:

A conducting wire 0.8 mm in diameter was soldered to a landless through-hole 1.0 mm in diameter and the wire was drawn on a tensile tester at a rate of 50 mm/min. The maximum load at which the through-hole plating was drawn out was recorded as the through-hole drawing strength.

(3) The interlayer peel strength was determined by the method for conductor pel strength determination as described in JIS S 5012 using test specimens 1 cm in width.

(4) The mesh distortion means that glass cloth meshes are out of alignment. The extent of mesh distortion is expressed in terms of the amount of displacement perpendicular to and from the straight line of alignment (one meter in length) as seen on the glass cloth plane.

What is claimed is:

1. An electrical laminate comprising a cured assemblage of a plurality of glass fiber substrates impregnated with a curable resin composition consisting essentially of (a) 30 to 90 percent by weight of the entire resin composition of a mixture of an unsaturated polyester and a monomer for crosslinking said unsaturated polyester, the acid component and the glycol component of said unsaturated polyester consisting of an unsaturated polybasic carboxylic acid and a halogenated bisphenol A-ethylene or propylene oxide adduct, respectively; and (b) 10 to 70 percent by weight of an epoxy acrylate resin produced by reacting a polyepoxy compound with an equivalent quantity, relative to said epoxy compound, of acrylic or methacrylic acid.

2. An electrical laminate comprising a curable resin composition as claimed in claim 1 wherein a halogenated bisphenol A-ethylene or propylene oxide adduct accounts for at least 10 mole percent of the glycol component constituting a halogenated bisphenol unsaturated polyester resin.

3. An electrical laminate comprising a curable resin composition as claimed in claim 1 wherein neopentyl glycol or a halogenated derivative thereof accounts for at least 10 mole percent of the balance of glycol component after exclusion of halogenated bisphenol A-ethylene or propylene oxide adduct.

4. An electrical laminate as claimed in claim 1 wherein a vinyl-or carboxy-terminated liquid butadiene based oligomer soluble in said curable resin composition is contained in a proportion of 1 to 10 weight parts to each 100 weight parts of said curable resin composition.

5. An electrical laminate as claimed in claim 1 wherein a metal foil is laminated to an insulating layer consisting of a plurality of glass fiber substrates impregnated with said curable resin composition, an epoxy adhesive layer containing at least 5 weight percent of a bisphenol S epoxy resin being interposed between said metal foil and said insulating layer.

6. An electrical laminate as claimed in claim 1 wherein said glass fiber substrates are a glass cloth disposed on either side of the laminate and a glass nonwoven fabric interposed therebetween as a core layer.

* * * * *